(12) United States Patent
Von Werne et al.

(10) Patent No.: US 8,896,071 B2
(45) Date of Patent: Nov. 25, 2014

(54) REDUCING DEFECTS IN ELECTRONIC SWITCHING DEVICES

(75) Inventors: Timothy Von Werne, London (GB); Catherine Mary Ramsdale, Cambridgeshire (GB); Henning Sirringhaus, Cambridgeshire (GB)

(73) Assignee: Plastic Logic Limited, Cambridge, Cambridgeshire (GB)

( * ) Notice: Subject to any disclaimer, the term of this patent is extended or adjusted under 35 U.S.C. 154(b) by 552 days.

(21) Appl. No.: 12/599,553

(22) PCT Filed: May 12, 2008

(86) PCT No.: PCT/EP2008/055800
§ 371 (c)(1),
(2), (4) Date: Jan. 14, 2010

(87) PCT Pub. No.: WO2008/138914
PCT Pub. Date: Nov. 20, 2008

(65) Prior Publication Data
US 2010/0155708 A1 Jun. 24, 2010

(30) Foreign Application Priority Data

May 11, 2007 (GB) .................................. 0709093.9

(51) Int. Cl.
*H01L 29/78* (2006.01)
*H01L 51/05* (2006.01)
*H01L 21/312* (2006.01)
*H01L 51/00* (2006.01)

(52) U.S. Cl.
CPC .......... *H01L 51/0541* (2013.01); *H01L 51/052* (2013.01); *H01L 51/0529* (2013.01); *H01L 51/0035* (2013.01); *H01L 21/312* (2013.01)

USPC ...... 257/410; 257/40; 257/411; 257/E21.625; 257/E51.007; 438/287; 438/591; 438/260; 438/99

(58) Field of Classification Search
None
See application file for complete search history.

(56) References Cited

U.S. PATENT DOCUMENTS

| 3,646,665 | A | * | 3/1972 | Kim | 438/216 |
| 4,140,548 | A | * | 2/1979 | Zimmer | 438/301 |
| 5,366,905 | A | * | 11/1994 | Mukai | 438/7 |
| 6,200,865 | B1 | * | 3/2001 | Gardner et al. | 438/291 |
| 6,251,800 | B1 | * | 6/2001 | Sun et al. | 438/763 |
| 6,819,853 | B2 | * | 11/2004 | Lam et al. | 385/131 |
| 2002/0113521 | A1 | * | 8/2002 | Rapp et al. | 310/313 R |
| 2003/0059975 | A1 | * | 3/2003 | Sirringhaus et al. | 438/99 |
| 2004/0058509 | A1 | * | 3/2004 | Moll et al. | 438/435 |
| 2004/0113229 | A1 | * | 6/2004 | Gonzalez et al. | 257/509 |

(Continued)

FOREIGN PATENT DOCUMENTS

| EP | 1657751 | * | 5/2006 |
| EP | 1657751 | A1 | 5/2006 |
| WO | 2006/129126 | A2 | 12/2006 |

*Primary Examiner* — Fei Fei Yeung Lopez
(74) *Attorney, Agent, or Firm* — Sughrue Mion, PLLC

(57) ABSTRACT

A technique for isolating electrodes on different layers of a multilayer electronic device across an array containing more than 100000 devices on a plastic substrate. The technique comprises depositing a bilayer of a first dielectric layer (6) of a solution-processible polymer dielectric and a layer of parylene (9) to isolate layers of conductor or semiconductor on different levels of the device. The density of defects located in the active area of one of the multilayer electronic devices is typically more than 1 in 100000.

13 Claims, 4 Drawing Sheets

(56) References Cited

U.S. PATENT DOCUMENTS

| | | | |
|---|---|---|---|
| 2004/0146655 A1* | 7/2004 | Seidl et al. | 427/402 |
| 2005/0104058 A1* | 5/2005 | Veres et al. | 257/40 |
| 2005/0285102 A1* | 12/2005 | Koo et al. | 257/40 |
| 2006/0151781 A1* | 7/2006 | Kim et al. | 257/40 |
| 2006/0214154 A1 | 9/2006 | Yang et al. | |
| 2006/0223222 A1 | 10/2006 | Choi et al. | |
| 2007/0099005 A1* | 5/2007 | Leung et al. | 428/447 |
| 2007/0235741 A1* | 10/2007 | Nakamura et al. | 257/79 |
| 2008/0076872 A1* | 3/2008 | Hahn et al. | 524/852 |
| 2008/0216704 A1* | 9/2008 | Eisenbeis et al. | 106/14.05 |

* cited by examiner

200
REDUCING DEFECTS IN ELECTRONIC SWITCHING DEVICES

CROSS REFERENCE TO RELATED APPLICATION

This application is a National Stage of International Application No. PCT/EP2008/055800 filed May 12, 2008, claiming priority based on GB Patent Application No. 0709093.9, filed May 11, 2007, the contents of all of which are incorporated herein by reference in their entirety.

The present invention relates to a technique for reducing defects in electronic switching devices. In one embodiment, it relates to reducing defects in thin-film transistor (TFT) circuits on a flexible plastic substrate.

There is significant interest in realizing active electronic circuits on flexible plastic substrates, such as poly-ethylene-terephtalate (PET) or poly-ethylene-naphtalate for applications in low-cost, flexible and/or unbreakable electronic devices. One of the technical challenges with flexible, plastic substrates is the poor surface quality of flexible substrates. Compared to a high-performance glass substrate as used, for example, in active matrix liquid crystal display manufacturing a plastic substrate such as PET or PEN contains a significantly larger density of particle defects and/or scratches (see for example, B. McDonald, Proceedings of the USDC Flexible Display Workshop, Phoenix, USA (2006)). These particle defects are partly related to particle inclusions during the manufacturing of the plastic substrate or due to deposition of particles onto the surface of the substrate. Due to the high electrical resistivity of plastic substrates electrostatic effects lead to a strong attraction of particles onto the surface of the substrate. This leads to a much increased surface roughness even if planarising layers are used on the surface of the plastic substrate to reduce the surface roughness.

In a TFT circuit the gate dielectric separating the gate electrode from the semiconducting layer/source-drain electrodes generally needs to have very low leakage current and low number of defects and electrical shorts in order to achieve a high device yield. In the case of TFTs using organic semiconducting active layers solution-processible polymer gate dielectrics have been used widely. However, on a large-area plastic substrate, the inventors have found that the relatively high defect density on the substrate surface can lead to a poor device yield. When the polymer dielectric is deposited by solution coating techniques, such as spin-coating, many particle defects on the substrate surface lead to spin defects, and spin marks which lead to poor morphology of the gate dielectric layer in the vicinity of the particle defects, and leading to a large number of shorted TFTs in the vicinity of the particle defects. In addition, if a particle defects falls within the active area of a device, a solution-processible polymer dielectric is under many conditions not able to coat the particle defect conformally, resulting in a TFT defect due to shorting of the gate dielectric.

It is an aim of the present invention to provide a technique of reducing such defects.

According to a first aspect of the present invention, there is provided an electronic switching device comprising source and drain electrodes, a semiconductor structure providing a semiconductor channel between the source and drain electrodes, and a gate electrode separated from the semiconductor structure by a gate dielectric structure; wherein said gate dielectric structure comprises a first, non-conformal polymer dielectric layer in contact with said semiconductor structure and a second, conformal dielectric layer between said first dielectric layer and said gate electrode.

The first non-conformal dielectric layer can, for example, be formed by a solution processing technique such as spin coating.

In one embodiment, the second dielectric layer comprises parylene.

In one embodiment, the first dielectric layer has a thickness of less than 200 nm.

In one embodiment, the second dielectric layer has a thickness of between 100-1000 nm.

In one embodiment, the field effect mobility is greater than 0.01 cm$^2$/Vs.

In one embodiment, said gate electrode is located above said semiconductor layer and said gate dielectric layer.

According to another aspect of the present invention, there is provided an array of electronic switching devices formed on a substrate and each including a non-conformal dielectric layer; wherein not more than 0.1% of the total number of the devices formed on the substrate exhibit a leakage current of more than 1 μA/cm$^2$ at an electric field of 5×10$^5$ V/cm.

In one embodiment, each of said electronic switching devices comprises an additional dielectric layer.

In one embodiment, said additional dielectric layer comprises a layer of parylene.

In one embodiment, the non-conformal dielectric layer has a thickness of less than 200 nm.

In one embodiment, the said additional dielectric layer has a thickness of between 100-1000 nm.

In one embodiment, the field effect mobility of each electronic switching device is greater than 0.01 cm$^2$/Vs.

According to another aspect of the present invention, there is provided a method of producing an electronic switching device comprising; forming source and drain electrodes and a semiconductor structure providing a semiconductor channel between the source and drain electrodes; depositing a first dielectric layer over said semiconductor structure using a solution processing technique; depositing a second dielectric layer over said first dielectric layer using a chemical vapour deposition technique; and depositing a gate electrode over said second dielectric layer.

In one embodiment, the second dielectric layer comprises parylene.

In one embodiment, the first dielectric layer has a thickness of less than 200 nm.

In one embodiment, the second dielectric layer has a thickness of between 100-1000 nm.

According to another aspect of the present invention, there is provided an electronic switching device comprising source and drain electrodes, a semiconductor structure providing a semiconductor channel between the source and drain electrodes, and a gate electrode separated from the semiconductor structure by a gate dielectric structure; wherein said gate dielectric structure comprises a first polymer dielectric layer in contact with said semiconductor structure and a second conformal dielectric layer between said first dielectric layer and said gate electrode.

According to one embodiment of the present invention, a gate dielectric for an organic TFT on a plastic substrate comprises a first solution-processible polymer dielectric deposited on top of the organic semiconductor layer, and a further dielectric layer of parylene deposited on top in a bilayer stack. The first dielectric layer is selected to protect the surface of the organic semiconductor during the deposition of the parylene layer and provides an optimum electronic structure of the active interface leading to high device performance and stability, and to provide a priming surface to ensure good adhesion and step coverage for the subsequent deposition of the parylene. The parylene layer can then be deposited under conditions that are optimized to ensure a pin-hole free, and conformal gate dielectric even when deposited over particle defects and rough features of the plastic substrate without resulting degradation in the performance and stability of the organic TFT.

The inventors have found that if a first solution-processible polymer dielectric is inserted between the polymer semiconductor active layer and the parylene layer deposition conditions can be used for the deposition of the parylene layer that allow excellent device yield across a large array of TFTs containing more than 100000 TFTs on plastic substrates. On such large arrays it is generally inevitable that particle defects are located within the active area of the device. Devices that contain such particle defects in the active area tend to exhibit higher gate-to-source/drain leakage currents and electrical shorts, and/or lower breakdown voltages of the gate dielectric. The inclusion of the solution-processed gate dielectric layer enables achieving both a high device performance as well as excellent device yield on a large-area flexible substrate.

Typically a topographical non-uniformity which leads to protrusions or depressions of the substrate of more than 50-100 nm across a lateral dimension on the order of 1-100 µm needs to be considered a potential substrate defect because its size is such that it can lead to shorts/breakdown of the gate dielectric. Such defects can be detected on the substrate by optical inspection techniques, and the inventors have found that even on the best of the presently available plastic substrates there is a significant density of particles the size of which is larger or comparable to the typical gate dielectric thickness. With such high defect densities it is inevitable that on a large array containing more than 100000 TFTs some particle defects occur on the active area of one of the TFTs leading to potential electrical breakdown and shorts.

To help understanding of the invention, a specific embodiment thereof will now be described in detail, by way of example only, with reference to the accompanying drawings, in which.

Figure 1:
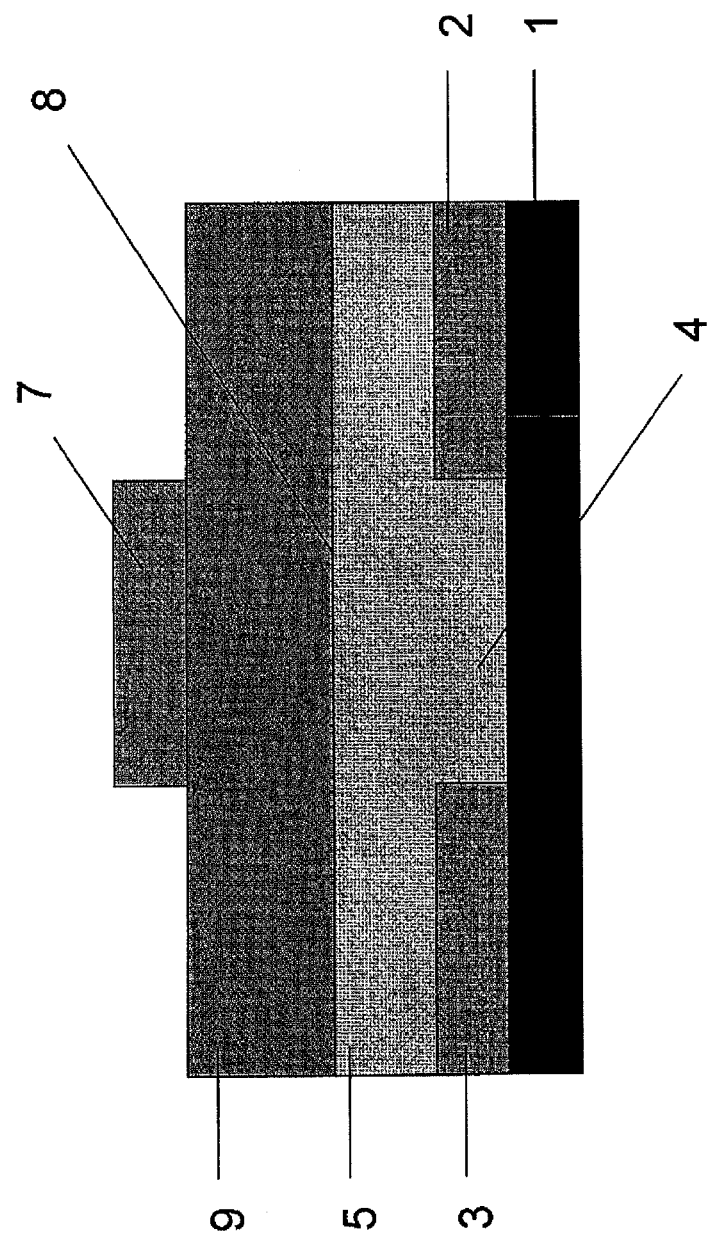
FIG. 1 shows for comparative purposes a multi-layer transistor device structure incorporating a parylene layer as a single gate dielectric layer.
Figure 2:
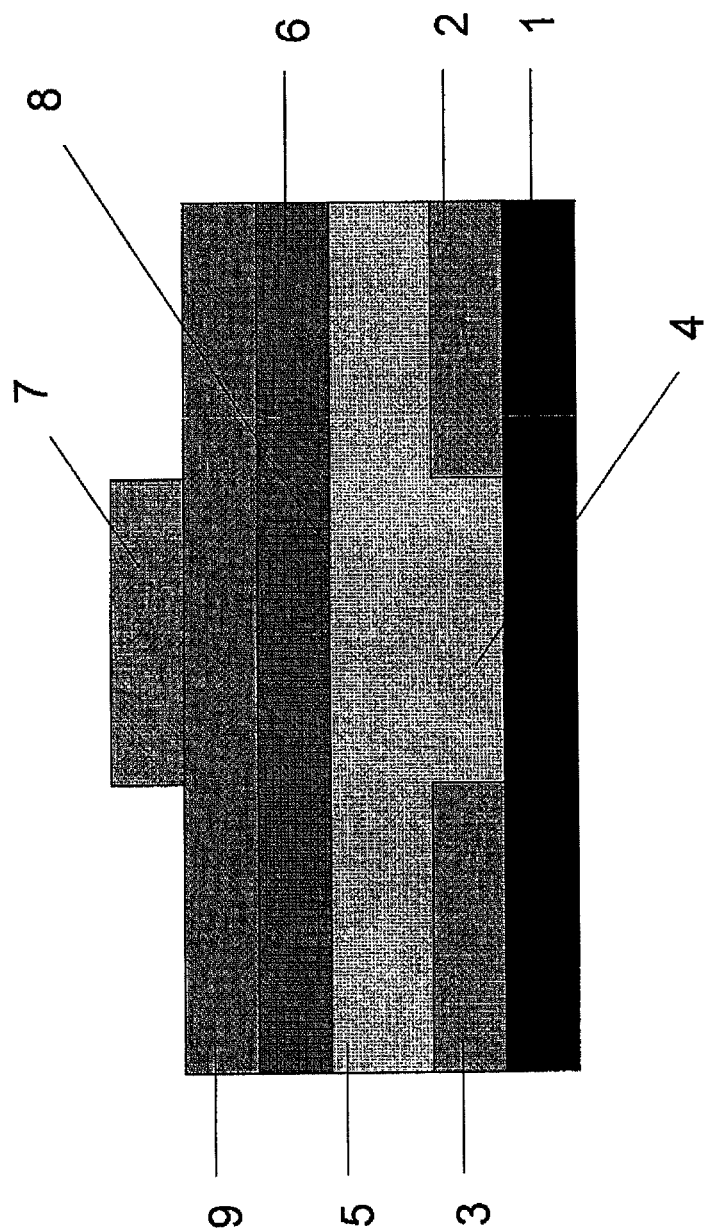
FIG. 2 shows a multi-layer transistor device structure that incorporates a bilayer dielectric stack incorporating a parylene layer according to an embodiment of the present invention.
Figure 3:
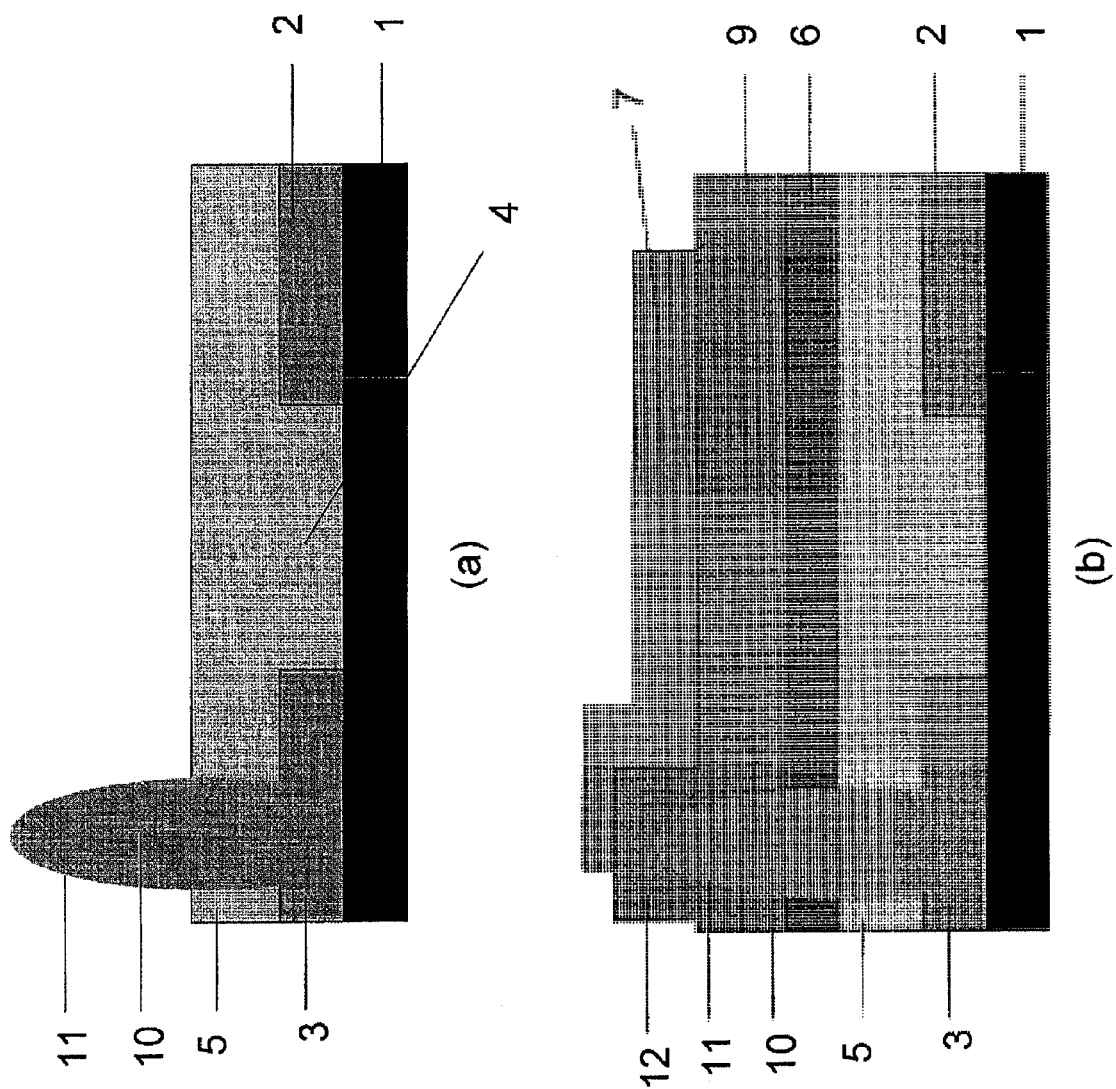
Figure 4:
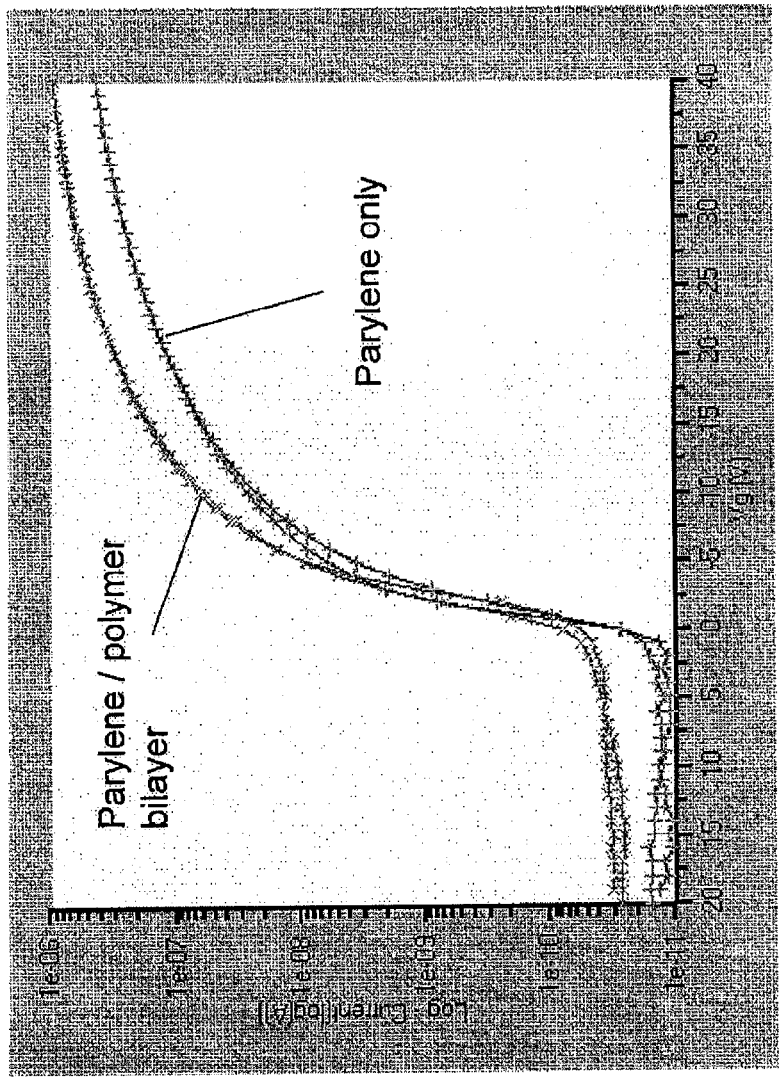

FIG. 3 illustrates a transistor device structure incorporating a bilayer dielectric stack according to an embodiment of the present invention wherein a particle defect is located in the active area of the device; and FIG. 4 shows transfer characteristics for both a TFT with a parylene only gate dielectric layer as shown in FIG. 1 and for a TFT including a polymer dielectric/parylene stack according to an embodiment of the present invention A device according to a first embodiment of the present invention is illustrated in FIG. 2. A dielectric bilayer is deposited over an underlying layered substrate. The dielectric stack incorporates a first solution-processible polymer dielectric layer and a parylene insulating layer as a second layer of a dielectric bilayer. The parylene insulating layer provides a completely pin-hole free and conformal film with good dielectric properties and therefore overcomes any defects resulting from the underlying dielectric layer of the bilayer (see discussion below). The first dielectric layer forms the active semiconductor-dielectric layer interface, that controls the field-effect mobility of the organic semiconductor, the amount of charge trapping and bias-stress degradation of the device. The first dielectric layer also protects the semiconducting layer during the parylene deposition. The first dielectric may comprise a number of defects and pinholes associated with defects on the surface of the plastic substrate, however, these do not lead to TFT failure due to the conformal coating properties of the parylene dielectric on top (see discussion below).

The TFT is formed in a top-gate configuration. Source and drain electrodes 2, 3 are deposited on a plastic substrate surface 1 resulting in region 4 which defines the channel length of the transistor device. The source-drain electrodes might be formed from a layer of inorganic metal such as gold patterned by techniques, such as, but not limited to, conventional lithography or laser ablation, or might be a solution-processible conducting material, such as a conducting polymer or a nanoparticle or precursor metal patterned by direct-write printing. Other techniques known in the prior art can be used as well. The substrate may be a flexible plastic substrate, such as a PET or PEN substrate. The substrate may also contain a planarization layer to reduce the surface roughness of the substrate.

The semiconductor layer 5 may then be deposited over the underlying source and drain electrodes 2, 3. The semiconducting layer consists of a thin film of an organic semiconducting layer such as, but not limited to, a thin film of a small molecule organic semiconductor such as, but not limited to, pentacene, oligothiophene, phtalocyanine, $C_{60}$ or derivatives thereof, or a thin film of a conjugated polymer semiconductor, such as, but not limited to, a polyarylamine, polyfluorene or polythiophene or derivative thereof. For the deposition of the semiconducting material a broad range of deposition techniques may be used including, but not limited to, inkjet printing, soft lithographic printing (J. A. Rogers et al., Appl. Phys. Lett. 75, 1010 (1999); S. Brittain et al., Physics World May 1998, p. 31), screen printing (Z. Bao, et al., Chem. Mat. 9, 12999 (1997)), and photolithographic patterning (see WO 99/10939), offset printing, spin-coating, blade coating or dip coating, curtain coating, meniscus coating, spray coating, or extrusion coating. In the case of small molecule semiconductors the semiconducting layer may also be deposited by vacuum deposition.

The first gate dielectric layer is then deposited onto the layered substrate. The first gate dielectric layer is preferably a solution processible polymer gate dielectric, that can be deposited uniformly across the substrate with a typical thickness on the order of preferably 10-1000 nm, most preferably 50-300 nm. Examples of polymer dielectrics that can be used include, but are not limited to polymethylmethacrylate (PMMA), polyisobutylene (PIB), polyethylene, polypropylene, polystyrene (PS), poly-4-vinylphenol (PVP), or polyvinylalcohol (PVA) or copolymers thereof. The material of the initial dielectric layer 6 of the bilayer is chosen for the materials dielectric properties and therefore suitability at the dielectric layer/semiconductor layer interface 8, with the aim of optimising the performance of the transistor. General criteria for selecting gate dielectric materials for solution-processed polymer semiconductors are described, for example, in H. Sirringhaus, Adv. Mat, 17, 1 (2005). One technique involves depositing the first gate dielectric layer from a solvent that does not lead to dissolution or swelling of the underlying semiconducting layer, as is demonstrated in WO01/47043. The said dielectric material may be deposited in the form of a continuous layer, by techniques such as, but not limited to, inkjet printing, gravure printing, flexographic printing, spray or blade coating. However, preferably, the technique of spray coating is used.

The first gate dielectric layer may also be a multi-component dielectric comprising more than one material or a multilayer structure comprising more than one dielectric layers.

After the deposition of the first gate dielectric layer a second dielectric layer of parylene 9 is deposited onto the substrate.

Parylene is deposited by chemical vapour deposition. A precursor of a parylene dimer is dissociated/cracked at high temperatures into a reactive monomer, and is transported by a flow of inert gas to the substrate where the reactive radicals react and form a parylene polymer (see below). A number of different parylene derivatives is available with different substituents X═H (Parylene N), X═Cl (Parylene C with one Cl substituent or Parylene D with two Cl substituents).

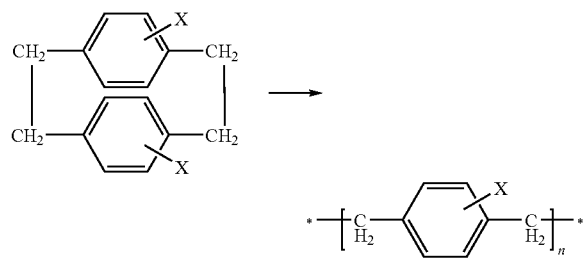

There are no catalysts or solvents required for this process that could cause unnecessary stress on other components of a device. Due to the gaseous nature of the vacuum deposition process, parylene is able to penetrate and coat surfaces, which is unachievable by solution processing coatings. Due to the conformal properties of parylene, multiple coats of thin layers of the material are not necessary to achieve the above result.

The thickness of the parylene dielectric layer is on the order of 100-1000 nm. Under such conditions, the inventors have observed that the devices exhibit identical mobility and bias stress stability to devices with a gate dielectric layer formed from the first dielectric layer without parylene layer. The inclusion of the first gate dielectric layer between the semiconductor and the parylene layer leads to a significant improvement of device performance compared to an otherwise identical structure in which the parylene is deposited directly on top of the semiconducting polymer layer (such as a layer of polyarylamine, polythiophene, or poly-dioctylfluorene-co-bithiophene), as shown for comparative purposes in FIG. 1, in which common reference numerals are used to designate components common with FIG. 2. FIG. 4 shows a graph that compares device characteristics for polymer TFTs comprising a parylene only gate dielectric (FIG. 1) and polymer TFTs comprising a polymer dielectric-parylene bilayer stack gate dielectric (FIG. 2). The latter exhibits significantly improved performance with a field-effect mobility which is higher by a factor of 2-3 than that of the parylene-only device. It has also been found that the bias stress stability of devices with parylene dielectric deposited directly on the surface of the semiconducting layer is significantly worse than that of devices where the deposition of the parylene is preceded by the deposition if a solution processed polymer gate dielectric.

These results show clearly that the first dielectric layer provides an effective protection of the active surface of the semiconducting layer during the chemical vapour deposition of the parylene. The beneficial effect of the polymer dielectric interlayer has been observed for a broad range of polymer dielectrics, including gate dielectrics that have a similar dielectric constant as parylene. Without wanting to be bound by theory, it is thought that a possible explanation for this behaviour is that the first polymer gate dielectric acts to prevent semiconductor degradation that might occur when the highly reactive parylene radicals from the gas phase polymerize on the surface of the substrate.

The devices are completed by deposition of a gate electrode 7 and interconnect lines. The gate electrode may be gold, copper or printable inorganic nanoparticles of silver, or alternatively a conducting polymer, such as polyethylenedioxythiophene doped with polystyrene sulfonic acid (PEDOT/PSS) may be used. The gate electrode is deposited using techniques such as sputtering or evaporation techniques and patterned by lithography or laser ablation or solution processing techniques such as spin, dip, blade, bar, slot-die, gravure, offset or screen printing or ink jet printing. Additional layers such common electrodes or pixel electrodes may also be deposited on the same level as the gate electrode or on upper layers of the device. Additional passivation layers to isolate for example the gate electrodes from the pixel electrodes on an upper level may also be deposited.

Due to the protective nature of the first gate dielectric layer deposition conditions can be used for the parylene that lead to good dielectric properties, low leakage, current high dielectric breakdown strength, and conformal coating of particle defects on the substrate. Typical deposition conditions for the parylene are as follows: The dimer para-xylylene is vaporized in the vaporization zone at 180° C., cleaves in the pyrolysis zone at 690° C., and polymerizes in the deposition zone onto the sample held near room temperature and pressure 16 mTorr.

It can be important to achieve a high device yield and device uniformity over a large array of devices. In the case of an active matrix display the device contains typically more than 1 million TFTs. It can be the case that no (or only very few) pixel outs/non-working TFTs can be tolerated. This is particularly difficult to achieve on plastic substrates since the quality of the plastic substrate is generally much poorer than conventional glass substrates. Plastic substrates contain a relatively high density of scratches, surface inclusions, particles defects, etc. They are also subject to electrostatic charging making it more likely that further defects are generated by particles depositing onto the substrate during the manufacturing process.

Parylene is known to form fully conformal, protective polymer coating layer, and this property is used in manufacturing of products such as manufacturing of printhead for inkjet printers. Parylene has also been used as the sole dielectric material in experimental individual transistor devices (WO2005/076367 and Appl. Phys. Lett. 82, 1739 (2003) However, the inventors believe that they are the first to show that parylene is able to provide sufficient isolation over a large array of TFTs to meet requirements for large-area TFT manufacturing on plastic substrates.

The inventors have found that when parylene is deposited directly onto the semiconducting layer a higher density of pixel defects tends to result, i.e. it is not always possible to conformally coat particle defects in the active area of the device in such a way that complete electrical isolation between the source-drain electrodes and the gate electrode can be achieved. This results in too many pixel-outs, and failed devices are observed across an array of more than 100000 TFTs. This is believed to be because in order to minimize the chemical degradation of the polymer semiconductor deposition the process window for coating of the parylene has to be narrowed, and conditions for the parylene need to be used that avoid degradation of the polymer semiconductor. On large TFT arrays on flexible substrates it is impossible to avoid particle or other defects that are in the active area of one of the devices, for example, in an area in which source-drain electrodes or interconnects overlap with gate electrodes of interconnects. This is illustrated in FIG. 3 (a) which shows schematically a particle defect 10 in the active array of a TFT. In this specific example the particle defect is assumed to be present on the surface of the substrate prior to deposition of the metallic layer forming the source and drain electrodes. This means that some of the particle is likely to be covered with a metallised layer 11.

By introducing the first gate dielectric layer 6 in between the active semiconducting polymer and the parylene layer, standard deposition conditions as described above can be used for the deposition of the parylene layer. Not only is the device performance enhanced, but also there is an increased likelihood that the parylene coats any particle conformally 12 and isolates gate 7 and source-drain electrodes effectively even if a defect is present inside the active area of the device (FIG. 3 (b)). By introducing a first solution-processible polymer dielectric between the polymer semiconductor active layer, a wide process window can be achieved for the deposition of the parylene layer, and deposition conditions such as the ones described above can be used to achieve excellent device yield across a large array of TFTs containing more than 100000 TFTs on plastic substrates. As mentioned above, on such large arrays it is inevitable that particle defects are located within the active area of the device (as shown in FIG. 3), and devices that do contain such particle defects in the active area would otherwise tend to exhibit higher gate-to-source/drain leakage currents and electrical shorts, and/or lower breakdown voltages of the gate dielectric.

The inclusion of the solution-processed gate dielectric layer in between the solution-processible polymer semiconductor and the parylene layer enables the achievement of both a high device performance of the TFTs as well as excellent device yield on a large-area flexible substrate containing more than 100000 TFTs.

The gate dielectric structure according to the present invention is capable of maintaining a high gate dielectric breakdown and high TFT yield on a large area flexible, plastic substrate even if particle defects are present on the surface of the plastic substrate. It also meets a number of other requirements identified in H. Sirringhaus, Adv. Mat, 17, 1 (2005) for achieving optimum device performance, reliability and stability.

For the semiconducting layer any vacuum or solution processible conjugated polymeric or oligomeric material that exhibits adequate field-effect mobilities exceeding $10^{-3}$ cm$^2$/Vs, preferably exceeding $10^{-2}$ cm$^2$/Vs, may be used. Suitable materials are reviewed for example in H. E. Katz, J. Mater. Chem. 7, 369 (1997), or Z. Bao, Advanced Materials 12, 227 (2000). Other possibilities include small conjugated molecules with solubilising side chains (J. G. Laquindanum, et al., J. Am. Chem. Soc. 120, 664 (1998)), semiconducting organic-inorganic hybrid materials self-assembled from solution (C. R. Kagan, et al., Science 286, 946 (1999)), or solution-deposited inorganic semiconductors such as CdSe nanoparticles (B. A. Ridley, et al., Science 286, 746 (1999)) or inorganic semiconductor nano-wires (X. Duan, Nature 425, 274 (2003)).

Devices such as TFTs fabricated as described above may be part of a more complex circuit or device in which one or more such devices can be integrated with each other and/or with other devices. Examples of applications include logic circuits and active matrix circuitry for a display, sensor or a memory device, or a user-defined gate array circuit.

The technique according to the present invention is applicable not only to flexible plastic substrates containing surface defects, but also to any other flexible or rigid substrate containing such defects, such as a flexible steel, paper or thin glass substrate.

The particle defect illustrated in FIG. 3 is a mere example of a broader class of defects that can be conformally coated by the polymer-dielectric bilayer. These include, but are not limited to, scratches in the substrate, substrate inclusions, pinholes in the substrate or any other layer, and particles deposited during any of the prior manufacturing steps.

The isolation structure described above comprising a bilayer of a solution-processible polymer dielectric and a layer of parylene can be used for other purposes, such as general isolation between electrodes/interconnects on different levels in the active area of a multilayer electronic device, or isolation between data and addressing lines in different layers in the interconnect area of a multilayer electronic device. It might also be used on highly integrated logic circuits, that require layouts in which connections to and between TFTs need to be run on several different interconnect layers.

The structures described above could be supplemented by other conductive and/or semiconductive structures on the same substrate, for example interconnects. Multiple structures as described above may be formed on the same substrate, and may be connected together by electrically conductive interconnects to form an integrated circuit.

The applicant hereby discloses in isolation each individual feature described herein and any combination of two or more such features, to the extent that such features or combinations are capable of being carried out based on the present specification as a whole in the light of the common general knowledge of a person skilled in the art, irrespective of whether such features or combinations of features solve any problems disclosed herein, and without limitation to the scope of the claims. The applicant indicates that aspects of the present invention may consist of any such individual feature or combination of features.

Also, in view of the foregoing description it will be evident to a person skilled in the art that various modifications may be made to the above-described embodiments within the scope of the invention.

The invention claimed is:

1. An electronic switching device comprising:
   source and drain electrodes,
   a semiconductor structure providing a semiconductor channel between the source and drain electrodes, and
   a gate electrode separated from the semiconductor structure by a gate dielectric structure;
   wherein said gate dielectric structure comprises:
   a first non-conformal solution-processed dielectric layer which comprises pinholes, and is in contact with said semiconductor structure; and
   a second conformal dielectric layer between said first dielectric layer and said gate electrode, which second dielectric layer penetrates and coats a surface of the first dielectric layer,
   wherein the electronic switching device is a top-gate device; and wherein the second conformal dielectric layer comprises a polymer.

2. The electronic switching device as claimed in claim 1, wherein the first non-conformal solution-processed dielectric layer has a thickness of less than 200 nm.

3. The electronic switching device as claimed in claim 1, wherein the second conformal dielectric layer has a thickness of between 100-1000 nm.

4. The electronic switching device as claimed in claim 1, wherein the field effect mobility is greater than 0.01 cm$^2$/Vs.

5. The electronic switching device as claimed in claim 1, wherein said gate electrode is located above said semiconductor layer and said gate dielectric structure.

6. An array of electronic switching devices according to claim 1 formed on a substrate; wherein not more than 0.1% of the total number of the devices formed on the substrate exhibit a leakage current of more than 1 $\mu A/cm^2$ at an electric field of $5\times10^5$ V/cm.

7. The array of electronic switching devices as claimed in claim 6, wherein the first non-conformal solution-processed dielectric layer has a thickness of less than 200 nm.

8. The array of electronic switching devices as claimed in claim 6, wherein the second conformal dielectric layer has a thickness of between 100-1000 nm.

9. The array of electronic switching device as claimed in claim 6, wherein the field effect mobility of each electronic switching device is greater than 0.01 $cm^2/Vs$.

10. The electronic switching device as claimed in claim 1, wherein said second conformal dielectric layer is the uppermost layer of the gate dielectric structure between said semiconductor structure and said gate electrode.

11. The electronic switching device according to claim 1, wherein the first non-conformal solution-processed dielectric layer protects the semiconductor structure against degradation by the second conformal dielectric layer.

12. The electronic switching device according to claim 1, wherein the second conformal dielectric layer is deposited by transporting reactive monomers on a flow of inert gas to a surface of said first dielectric layer, where said reactive monomers react together and form said polymer.

13. The electronic switching device according to claim 1, wherein the second dielectric layer comprises parylene.

* * * * *